US006835442B2

(12) United States Patent
Kudo et al.

(10) Patent No.: US 6,835,442 B2
(45) Date of Patent: Dec. 28, 2004

(54) FLEXIBLE PRINTED WIRING BOARD

(75) Inventors: Noriaki Kudo, Kanuma (JP); Asaei Takabayashi, Kanuma (JP); Akitoshi Suzuki, Imaichi (JP); Shin Fukuda, Imaichi (JP)

(73) Assignees: Sony Chemicals Corp., Tokyo (JP); Circuit Foil Japan Co., Ltd., Imaichi (JP)

( * ) Notice: Subject to any disclaimer, the term of this patent is extended or adjusted under 35 U.S.C. 154(b) by 0 days.

(21) Appl. No.: 10/221,442

(22) PCT Filed: Jan. 9, 2002

(86) PCT No.: PCT/JP02/00033

§ 371 (c)(1), (2), (4) Date: Sep. 12, 2002

(87) PCT Pub. No.: WO02/058442

PCT Pub. Date: Jul. 25, 2002

(65) Prior Publication Data

US 2003/0132192 A1 Jul. 17, 2003

(30) Foreign Application Priority Data

Jan. 22, 2001 (JP) ........................................ 2001-12899

(51) Int. Cl.$^7$ ............................ B32B 15/00; H05K 1/00

(52) U.S. Cl. ....................... 428/209; 428/458; 428/469; 428/473.5; 428/699; 428/701; 428/702; 428/219; 428/607; 428/626; 428/632; 428/674; 428/901; 428/935; 428/704; 174/254; 174/256; 361/749; 361/751; 205/177; 205/178; 524/105; 524/106; 524/718; 524/720; 528/350

(58) Field of Search ................................ 428/209, 458, 428/469, 473.5, 699, 701–702, 219, 607, 626, 632, 674, 901, 935, 704; 174/254, 256; 361/749, 751; 205/177–178; 524/105–106, 718, 720; 528/350

(56) References Cited

U.S. PATENT DOCUMENTS

2001/0005730 A1 * 6/2001 Kudo et al. ................... 524/99

FOREIGN PATENT DOCUMENTS

| | | |
|---|---|---|
| EP | 1 014 765 A2 | 6/2000 |
| JP | A 56-87676 | 7/1981 |
| JP | B2 61-33906 | 8/1986 |
| JP | A 3-90938 | 4/1991 |
| JP | A 5-29740 | 2/1993 |
| JP | A 2000-177051 | 6/2000 |
| JP | A 2000-212280 | 8/2000 |
| JP | A 2001-11684 | 1/2001 |

* cited by examiner

*Primary Examiner*—Stephen Stein
*Assistant Examiner*—Ling Xu
(74) *Attorney, Agent, or Firm*—Oliff & Berridge, PLC

(57) ABSTRACT

A flexible printed board contains an unroughened electrodeposited copper foil, a zinc-based metallic layer provided thereon in an amount of 0.25 to 0.40 mg/dm$^2$, and a polyimide resin layer formed through the imidation of a polyamic acid layer provided on the zinc-based metallic layer.

3 Claims, No Drawings

FLEXIBLE PRINTED WIRING BOARD

TECHNICAL FIELD

The present invention relates to a flexible printed board comprising a copper foil and a polyimide resin layer formed thereon, with excellent adhesive strength between the copper foil and the polyimide resin layer, good flatness, and suitable for the implementation of fine wiring patterns.

BACKGROUND ART

Flexible printed boards having an insulating polyimide resin layer formed on a copper foil directly without using an auxiliary adhesive layer are manufactured by applying a polyamic acid varnish, obtained by addition polymerization of an aromatic dianhydride and an aromatic diamine in a solvent such as dimethylacetamide, onto a copper foil that has been subjected to a surface roughening pre-treatment in order to achieve a high adhesive strength, then drying the same to obtain a polyamic acid layer, further heating the polyamic acid layer to initiate the imidation, and thereby forming a polyimide resin layer on the copper foil.

In this context, copper foil refers mainly to rolled copper foils and electrodeposited copper foils, where electrodeposited copper foils are more widely used, because of the curling problems associated with rolled copper foils. In order to increase the adhesiveness between the electrodeposited copper foil and the polyimide resin layer, a roughening treatment is carried out on the surface of the foil manufactured by the electrolytic foil-making equipment (untreated copper foil), where the roughening treatment deposits minute copper particles on the foil. This roughening treatment is normally followed by a rust-inhibiting treatment.

Those printed wiring boards manufactured using the flexible printed boards as described above, that carry semiconductor devices and other kinds of electronic chip components, demand wiring layouts with ever higher fine-line densities, owing to the evolution of large-scale integration technologies. The roughening treatment of the electrodeposited copper foil, however, causes the loss of some etching properties of the copper foil, etching becomes problematic in high aspect-ratio boards, with undercut occurring during the etching, all of which hampers the achievement of the desired fine patterns.

Therefore, in flexible printed boards used in printed wiring boards, and in order to meet the demands imposed by fine pattern technologies, the extent of the electrodeposited copper foil roughening treatment is limited through low-profiling (decreasing roughness), with a view to minimize the occurrence of undercut during etching and to ensure insulation between patterns. For instance, Japanese Patent Application Laid-open No. H3-90938 discloses a low profiling method wherein the arithmetic mean roughness value of the electrodeposited copper foil Ra (as measured in the contact stylus test according to JIS B 0601) decreases to values from about 0.3 to about 0.8 $\mu$m.

However, low profiling the roughening of an electrodeposited copper foil lowers the adhesive strength between the electrodeposited copper foil and the insulating polyimide layer. For this reason, and because of the need to meet the highly demanding fine-line requirements of recent years, it is becoming increasingly difficult to maintain an intended adhesive strength, and there are also problems like the delamination (or peeling) of the wiring from the polyimide layer during processing.

The present invention solves the above problems in conventional technologies and provides a flexible printed board comprising a copper foil and a polyimide resin layer formed thereon, with excellent adhesive strength between the copper foil and the polyimide resin layer, good flatness, and suitable for the implementation of fine wiring patterns.

DISCLOSURE OF THE INVENTION

According to the present invention, it has been discovered that the etching characteristics of the copper foil can be improved and, at the same time, the adhesive strength between the electrodeposited copper foil and the polyimide resin layer can be enhanced, by the use of a low-curling electrodeposited copper foil with a zinc-based metallic layer deposited thereon, instead of carrying out a surface roughening of the electrodeposited copper foil.

In particular, the present invention provides a flexible printed board comprising an electrodeposited copper foil which has not been subjected to a surface roughening treatment, a zinc-based metallic layer deposited thereon in an amount of 0.25 to 0.40 mg/dm$^2$, and a polyimide resin layer provided on the zinc-based metallic layer, that has been formed by imidation of a polyamic acid layer.

BEST MODE OF CARRYING OUT THE INVENTION

Here follows a detailed description of the present invention:

The flexible printed board of the present invention comprises an electrodeposited copper foil, a zinc (Zn)-based metallic layer deposited thereon and a polyimide resin layer provided over the latter.

The electrodeposited copper foils used in the present invention are formed by electrolytic plating and have a better curling behavior compared to rolled copper foils, helping thus to prevent the curling of the flexible printed board. The electrodeposited copper foils used in the present invention have not been subjected to any roughening treatment, and they have preferably an arithmetic mean roughness value Ra of less than 0.3 $\mu$m (as measured in the contact stylus test according to JIS B 0601).

The thickness of the electrodeposited copper foil will depend on the applications of the flexible printed board. From the viewpoint of achieving fine wiring patterns, it should preferably be as small as possible, usually from 3 to 35 $\mu$m, preferably from 3 to 18 $\mu$m and more preferably from 3 to 12 $\mu$m.

The zinc-based metallic layer provided on the electrodeposited copper foil increases the adhesive strength between the electrodeposited copper foil and the polyimide resin layer. This zinc-based metallic layer contains metallic zinc or zinc compounds (for example, zinc oxide, zinc hydroxide) and may be a layer formed through electroplating, electroless plating, vapor deposition, sputtering, etc., electroplating being preferred on account of the easier control of the layer thickness that it affords. Suitable electroplating baths are, for instance, zinc sulfate plating baths, zinc chloride plating baths, zinc cyanide plating baths, zinc pyrophosphate plating baths, etc. Among these, zinc sulfate may be preferably used owing to its advantage as regards processing costs. Suitable electroplating conditions for this electrolyte are disclosed in Japanese Patent Publication No. S61-33906, column 4 line 39 to column 5 line 2.

If the amount of zinc-based metallic layer formed (deposited amount) is too small, the adhesive strength of the polyimide resin layer diminishes after heat aging; if excessive, acids and other solutions employed during the processing of the board may invade the interface between the polyimide resin layer and the electrodeposited copper foil and thus lower the adhesive strength; a minimum of 0.25 to 0.40 mg/$dm^2$ of metallic zinc equivalent should be used, preferably 0.26 to 0.34 mg/$dm^2$.

In the flexible printed board of the present invention, a further layer of chromium oxide ($Cr_2O_3$ layer) is preferably disposed between the zinc-based metallic layer and the polyimide resin layer. This can contribute to enhance the adhesive strength between the electrodeposited copper foil and the polyimide resin layer and to prevent the occurrence of rusting on the electrodeposited copper foil. This chromium oxide layer contains chromium oxide and can be formed through a chromate process commonly used (Japanese Patent Publication No. S61-33906, column 5 lines 17 to 38).

If the amount of chromium oxide layer formed (deposited amount) is too high, the adhesive strength with the polyimide resin layer will decrease, therefore preferred deposition amounts range usually from 0.001 to 0.1 mg/$dm^2$, preferably 0.005 to 0.08 mg/$dm^2$, preferably still from 0.03 to 0.05 mg/$dm^2$, based on a metal chromium.

The polyimide resin layer in the flexible printed board of the present invention is composed of a thermoresistant resin such as polyimide, polyamideimide, polybenzimidazole, polyimido ester and polyetherimide resins; here the polyimide resin film is not laminated by means of an adhesive layer; instead, a film of polyamic acid varnish (polyimide precursor) is usually applied onto the zinc-based metallic layer or the chromium oxide layer covering the electrodeposited copper foil, and is then heated to initiate the imidation.

The coefficient of linear thermal expansion of the polyimide resin layer should be kept between 10 to $30\times10^{-6}$ (1/K), preferably between 18 to $28\times10^{-6}$ (1/K). Such values, close to the linear thermal expansion range of the electrodeposited copper foil, will help minimize the occurrence of curling in the flexible printed board. Furthermore, the polyimide resin layer must have a softening point within the temperature range employed during the imidation of the formed polyamic acid varnish film (usually 300 to 400° C.). This will supposedly have the effect of relieving residual stresses created during the formation of the polyamic acid film.

The measurement of the "coefficient of linear thermal expansion" and "softening point" of the polyimide resin layer of the present invention may be carried out using a thermo-mechanical analyzer (TMA, from Seiko Instruments Co.). A specific example of measurement conditions are for instance: determining the TMA curve using a polyimide film sample 20 mm long, 4 mm wide and 20 $\mu$m thick, tensile mode under a 5 g load, temperature range of from 80° C. to 400° C. and a heating rate of 5° C./min.

In the present invention, "softening point" is defined as the intersection point of straight line extended, towards the high temperature region, from the linear part in the low temperature region with the straight line extended, towards the low temperature region, from the tangential line in the region where the displacement rate has increased due to the softening (according to the determination of penetration temperature in JIS K7196).

A specific example of the formation of a polyimide resin layer according to the present invention, that has a coefficient of linear thermal expansion ranging from 10 to $30\times10^{-8}$ (1/K) and has a softening point within the imidation temperature range, may involve, for instance, the selection of the compounds, and their respective proportions, that will be the aromatic diamine component and the aromatic dianhydride component for obtaining the polyamic acid in the polyamic acid varnish (a mixture containing polyamic acid obtained through addition-polymerization in solution of aromatic diamines and aromatic dianhydride), which in turn will form the polyimide resin layer.

The following conventional compounds may be used as the aromatic dianhydride component: pyromellitic dianhydride (PMDA), 3,4,3',4'-biphenyltetracarboxylic dianhydride (BPDA), 9,4,9',4'-benzophenonetetracarboxylic dianhydride (BTDA), or 9,4,3',4'-diphenylsulfonetetracarboxylic dianhydride (DSDA), etc.

The following conventional compounds may be used as the aromatic diamine component: 4,4'-diaminodiphenyl ether, paraphenylenediamine, 4,4'-diaminobenzanilide, 4,4'-bis(p-aminophenoxy)diphenyl sulfone, and 2,2-bis[4-(4-aminophenoxy)phenyl]propane, etc.

A preferred combination of the aromatic diamine and aromatic dianhydride components is for instance, a combination of an aromatic dianhydride component containing at least 80 mol % of biphenyl tetracarboxylic dianhydride and an aromatic diamine component containing at least 50 mol % of p-phenylene diamine.

The molar ratio of the aromatic diamine component and the aromatic dianhydride component constituting the polyamic acid may be an equimolar molar ratio, but there may be also a slight excess of aromatic dianhydride component or of aromatic diamine component. The proportion of such excess should preferably not be greater than 5 mol %. If any of the components is used in excess of 5 mol % or more, the mechanical strength of the final polyimide resin layer may suffer as a result. A particularly preferred molar ratio range is aromatic dianhydride component: aromatic diamine component=(1.00 to 1.03):1.00.

Conventional compounds may be used as the solvent for the synthesis of the polyamic acid, a preferred compound is for instance N-methyl-2-pyrrolidone. There are no specific restrictions as regards the amount of solvent to be used.

Furthermore, an imidazolyl-diaminoazine compound is preferably added to the polyamic acid varnish. This may contribute to further increase the adhesive strength of the polyimide resin layer.

The imidazolyl-diaminoazines used in the present invention are, for instance, compounds of general formula (1)

(1)

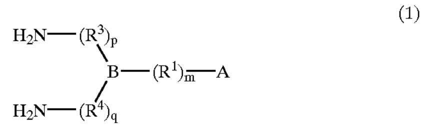

(where A is an imidazolyl group represented by formula (1a), (1b) or (1c):

(1a)

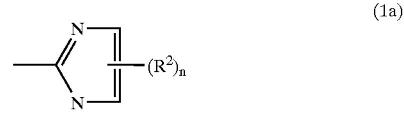

-continued (1b)

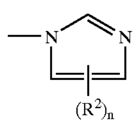

(1c)

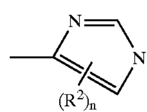

where $R^1$ is an alkylene group, m is 0 or 1. $R^2$ is an alkyl group, n is 0, 1 or 2. $R^3$ and $R^4$ are alkylene groups, p and q are each 0 or 1. B is an azine residue, a diazine residue or a triazine residue).

In the imidazolyl-diaminoazines of formula (1), when m is 0, there is no alkylene group $R^1$ and the imidazole ring binds directly with the azine, diazine or triazine residues. When m is 1, the alkylene group $R^1$ may be, for example, methylene, ethylene, propylene, etc.

When n is 0, there are no alkyl group $R^2$ and the imidazole ring binds with hydrogen atoms. When n is 1, the alkyl group $R^2$ may be for example methyl, ethyl, etc. When n is 2, the imidazole ring binds with two independent $R^2$ groups, and the alkyl group of $R^2$ may be independently methyl, ethyl, etc. $R^2$ may also bind with the nitrogen atoms of the imidazole ring, depending on the circumstances.

When p is 0, there is no alkylene group $R^3$ and the amino group binds directly with the azine, diazine or triazine residues; when p is 1, the alkylene group $R^3$ may be, for example, methylene, ethylene, etc.

When q is 0, there is no alkylene group $R^4$ and the amino group binds directly with the azine, diazine or triazine residues; when q is 1, the alkylene group $R^4$ may be, for example, methylene, ethylene, etc.

B is an azine, diazine or triazine residue. Preferred compounds are diamines containing triazine residues, on account of their relatively simple synthesis and commercial availability.

The following compounds (for which p and q are both 0) can be cited as specific examples of the preferred imidazolyl-diaminoazines of the formula (1).

2,4-diamino-6-[2-(2-methyl-1-imidazolyl)ethyl]-s-triazine, 2,4-diamino-6-[2-(2-ethyl-1-imidazolyl)ethyl]-s-triazine, 2,4-diamino-6-[1-(2-undecyl-1-imidazolyl)ethyl]-s-triazine, 2,4-diamino-6-[2-(2-imidazolyl)ethyl]-s-triazine, 2,4-diamino-6-[2-(1-imidazolyl)ethyl]-s-triazine, 2,4-diamino-6-(2-ethyl-4-imidazolyl)-s-triazine, 2,4-diamino-6-[2-(4-methyl-1-imidazolyl)ethyl]-s-triazine, 2,4-diamino-6-(2-ethyl-5-methyl-4-imidazolyl)-s-triazine, 2,4-diamino-6-(4-ethyl-2-methyl-1-imidazolyl)-s-triazine, 2,4-diamino-6-[3-(2-methyl-1-imidazolyl)propyl]-s-triazine, 2,4-diamino-6-[4-(2-imidazolyl)butyl]-s-triazine, 2,4-diamino-6-[2-(2-methyl-1-imidazolyl)propyl]-s-triazine, 2,4-diamino-6-[1-methyl-2-(2-methyl-1-imidazolyl)ethyl]-s-triazine, 2,4-diamino-6-[2-(2,5-dimethyl-1-imidazolyl)ethyl]-s-triazine, 2,4-diamino-6-[2-(2,4-dimethyl-1-imidazolyl)ethyl]-s-triazine, or 2,4-diamino-6-[2-(2-ethyl-4-methyl-1-imidazolyl)ethyl]-s-triazine.

Of these, the following compounds are preferred: 2,4-diamino-6-[2-(2-ethyl-4-methyl-1-imidazolyl)ethyl]-s-triazine, 2,4-diamino-6-[2-(2-methyl-1-imidazolyl)ethyl]-s-triazine, or 2,4-diamino-6-[1-(2-undecyl-1-imidazolyl) ethyl]-s-triazine.

If the proportion of imidazolyl-diaminoazines of formula (1) in the polyamic acid varnish composition is too low or too high, the adhesive strength of the polyimide insulating layer will be insufficient; whereas an excessive amount will cause a decrease in the thermal resistance and mechanical strength. Preferred proportions range from 0.1 to 10 parts by solids weight for 100 parts of polyamic acid varnish, more preferably from 0.1 to 5 parts by weight.

The polyamic acid varnish formulation according to the present invention may also include other conventional additives as needed.

The thickness of the polyimide resin layer constituting the present invention is not restricted in any particular way, though it usually ranges from 10 to 50 $\mu$m.

The flexible printed board of the present invention may be manufactured as follows. First, the addition polymerisation of the aromatic dianhydride component and the aromatic diamine component is carried out in a solvent. The conditions for this addition polymerisation may be adjusted according to the conditions used in conventional polyamic acid addition polymerisations. More specifically, the aromatic diamine component is first heated and dissolved in a solvent (for example, N-methyl-2-pyrrolidone), then an aromatic dianhydride is slowly added at 0 to 90° C., preferably at 5 to 50° C., in an atmosphere of nitrogen gas or another inert gas; the polymerisation continues for several hours yielding eventually a polyamic acid in solution. The imidazolyl-diaminoazines of formula (1) etc. are then added to this solution and mixed thoroughly to obtain the polyamic acid varnish.

This polyamic acid vanish is subsequently applied to the electrodeposited copper foil with a comma coater or the like and dried, yielding a polyamic acid layer as the polyimide precursor layer. To prevent foaming during the subsequent imidation step, the drying should preferably be performed in such a way that the residual volatile content (undried solvent and water generated by imidation) of the polyamic acid layer does not exceed 70%.

The resulting polyamic acid layer is heated to 300 to 400° C. in an inert atmosphere (for example, a nitrogen atmosphere) to initiate the imidation that will yield the polyimide resin layer. The flexible printed board of the present invention is thus obtained.

The flexible printed board obtained in the above manner has a good adhesive strength between the electrodeposited copper foil and the polyimide resin layer. Moreover, the electrodeposited copper foil suffers almost no curling before or after etching. Also, the presence of imidazole residues provides an anti-rusting effect, which prevents the occurrence of corrosion and discoloration on the surface of the copper foil (the surface on which a polyimide resin layer is formed), avoiding as well electrical migration phenomena, caused by copper ions, in the flexible printed boards used as printed wiring boards.

EXAMPLES

The present invention will now be described in detail.

Examples 1 to 5 and comparative examples 1 to 4: 83.3 g (0.77 mol) of paraphenylenediamine (PDA, from Oshin Kasei Co.) and 46.0 g (0.23 mol) of 4,4'-diaminodiphenyl ether (DPE, from Wakayama Seika Co.) were dissolved in about 3 kg of the solvent N-methyl-2-pyrrolidone (NMP, from Mitsubishi Chemical Co.) under a nitrogen gas atmosphere in a 5-L reaction vessel with temperature control, keeping the solution at 50° C. The reaction was then allowed to proceed for 3 hours under the gradual addition of 297.1 g (1.01 mol) 3,4,3',4'-biphenyltetracarboxylic dianhydride (BPDA from Mitsubishi Chemical Co.). The reaction solution was then cooled to room temperature, and a polyamic acid having a solids content of about 14% and viscosity 15 Pa·S (25° C.) was obtained.

Then 21.3 g (5 parts relative to 100 parts of polyamic acid) of the imidazolyl-diaminoazine 2,4-diamino-6-[2-(2-methyl-1-imidazolyl)ethyl]-s-triazine were added and dissolved in the polyamic acid to obtain the polyamic acid varnish.

Next, unroughened electrodeposited copper foils from Circuit Foil Japan Co., Ltd. thickness 12 $\mu$m (WS foil, M face roughness Ra=0.23 $\mu$m, Rz=1.15 $\mu$m (roughness measured in a contact-stylus test instrument as set out in JIS B 0601)) were subjected to various different surface treatments to prepare electrodeposited copper foils A through I as shown in table 1. (Here, electrodeposited copper foils A through G are unroughened copper foils on the surface of which a zinc-based metallic layer is formed, with the different metallic zinc equivalent amounts listed in Table 1, and a further layer of chromium oxide is then added onto the zinc-based metallic layers, in the metallic chromium equivalent quantities listed in the table. The electrodeposited copper foil H is an unroughened electrodeposited copper foil on the surface of which a zinc-based metallic layer alone is formed. The electrodeposited copper foil I is an unroughened electrodeposited copper foil itself with no layer formed thereon.)

A coat of the previously prepared polyamic acid varnish was applied onto each of these electrodeposited copper foils; after being gradually dried to prevent foaming, they were imidated by being kept for 30 minutes at 350° C. in a nitrogen atmosphere to obtain flexible printed boards with a polyimide resin layer 25 $\mu$m thick (Table 2).

The adhesive strength at 23° C. of the of the polyimide resin layers of the flexible printed boards thus obtained were then measured through their peeling strength (N/cm) according to JIS C6471 (peeling in a 90-degree direction, specimen width 1.59 mm). The peeling strength of the obtained flexible printed boards was also measured as above after carrying out a thermal resistance test through a heat ageing consisting in by keeping the boards at 150° C. for 240 hours; the decrease in the adhesive strength was calculated through the difference in the peeling strengths before and after the heat ageing. Similarly, the peeling strength of the obtained flexible printed boards was measured as above after carrying out an acid resistance test in which the boards were immersed in 18% hydrochloric acid for 1 hour; the decrease in adhesive strength after the acid resistance test was calculated based on the difference in the peeling strengths before and after the acid resistance test. The results obtained are shown in Table 2.

Finally, the curling of the flexible printed boards was evaluated as follows. First, the polyimide resin films of the flexible printed boards were isolated by etching away the electrodeposited copper foil in its entirety using a commercial copper chloride etching solution.

From the polyimide resin films thus obtained and the unetched flexible printed boards, 10 cm square specimens were cut off respectively and were placed on a flat surface at 23° C. and 60% RH. Then the averages of the distances between the four corners of the specimens and the flat surface were measured. Average values of 5 mm or less were rated as substantially flat. The results obtained are shown in Table 2.

TABLE 1

| Electro-deposited copper foil | Roughening treatment | Zinc-based metallic layer mg/dm$^2$ | $Cr_2O_3$ layer mg/dm$^2$ |
|---|---|---|---|
| A | none | 0.201 | 0.031 |
| B | none | 0.210 | 0.041 |
| C | none | 0.259 | 0.032 |
| D | none | 0.260 | 0.045 |
| E | none | 0.305 | 0.044 |
| F | none | 0.340 | 0.050 |
| G | none | 0.421 | 0.040 |
| H | none | 0.310 | — |
| I | none | — | — |

TABLE 2

| | Electro-deposited copper foil (Table 1) | Peeling strength (N/cm) | Curling: Before Etching | Curling: After Etching | Adhesive strength Decease (%): After Heat Resistance Test | Adhesive strength Decease (%): After Acid Resistance Test |
|---|---|---|---|---|---|---|
| Example | | | | | | |
| 1 | C | 8.6 | Substantially flat | Substantially flat | −1 | −2 |
| 2 | D | 8.2 | Substantially flat | Substantially flat | −3 | −2 |
| 3 | E | 8.2 | Substantially flat | Substantially flat | −1 | +1 |
| 4 | F | 8.3 | Substantially flat | Substantially flat | −3 | −2 |
| 5 | H | 7.9 | Substantially flat | Substantially flat | −5 | −7 |
| Comp. Ex. | | | | | | |
| 1 | A | 8.2 | Substantially flat | Substantially flat | −44 | −3 |
| 2 | B | 8.3 | Substantially flat | Substantially flat | −47 | −3 |
| 3 | G | 7.5 | Substantially flat | Substantially flat | −4 | −32 |
| 4 | I | (Partial delamination occurred during the imidation step) | | | | |

The results in table 2 show that the flexible printed boards in examples 1 to 5, with a zinc-based metallic layer ranging from 0.25 to 0.40 mg/dm$^2$, have an excellent adhesive strength, no curling and superior thermal and acid resistance. In particular, as can be seen when the performance of flexible printed board in example 5, where the electrodeposited copper foil used has no chromium oxide layer provided over the zinc-based metallic layer, is compared with those in examples 1 to 4, where the electrodeposited copper foils do have such a chromium oxide layer, the adhesive strength is higher when a chromium oxide layer is present.

Moreover, the results of comparative examples 1 to 3 demonstrate that the thermal resistance diminishes when the amount of zinc-based metallic layer lies outside the 0.25 to 0.4 mg/dm$^2$ range.

The flexible printed board prepared in comparative example 4, with no zinc-based metallic layer, suffered a partial delamination during the imidation step, which rendered it unsuitable for further use.

INDUSTRIAL APPLICABILITY

By means of the present invention it is possible to provide a flexible printed board, comprising a copper foil and a polyimide resin layer derived from polyamic acid formed thereon, with excellent adhesive strength between the copper foil and the polyimide resin layer, good flatness, and suitable for the implementation of fine-line wiring.

What is claimed is:

1. A flexible printed board comprising:

an electrodeposited copper foil which has not been subjected to a surface roughening treatment and has an arithmetic average roughness Ra of less than 0.3 $\mu$m;

a zinc-based metallic layer provided on the electrodeposited copper foil in an amount of 0.259 to 0.340 $mg/dm^2$;

a chromium oxide layer which is formed in an amount of 0.032 to 0.05 $mg/dm^2$ on the zinc-based metallic layer; and a polyimide resin layer formed by imidation of a polyamic acid provided on the chromium oxide layer, and has a linear thermal expansion coefficient of 10 to $30\times10^{-6}$ (1/K) and exhibits a softening point in the temperature range from 300 to 400° C.

2. The flexible printed board according to claim 1, wherein said polyamic acid layer is formed from polyamic acid varnish obtained by polymerisation of an aromatic dianhydride component containing at least 80 mol % of biphenyl tetracarboxylic dianhydride with an aromatic diamine component containing at least 50 mol % p-phenylene diamine, in a molar ratio (1.00 to 1.03):1.00.

3. The flexible printed board according to claim 2, wherein the polyamic acid varnish contains imidazolyl-diaminazines.

* * * * *